United States Patent
Saleh

(10) Patent No.: US 7,272,061 B2
(45) Date of Patent: Sep. 18, 2007

(54) DYNAMIC PRE-CHARGE LEVEL CONTROL IN SEMICONDUCTOR DEVICES

(75) Inventor: Hugo Saleh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 11/041,345

(22) Filed: Jan. 24, 2005

(65) Prior Publication Data

US 2006/0164904 A1    Jul. 27, 2006

(51) Int. Cl.
*G11C 7/00* (2006.01)
(52) U.S. Cl. .................. 365/203; 365/156; 365/190
(58) Field of Classification Search .................. 365/203
See application file for complete search history.

(56) References Cited

U.S. PATENT DOCUMENTS

| | | | |
|---|---|---|---|
| 4,899,317 A * | 2/1990 | Hoekstra et al. ............ 365/203 |
| 5,604,705 A * | 2/1997 | Ackland et al. ............ 365/205 |
| 5,995,431 A * | 11/1999 | Inui et al. .................... 365/203 |
| 6,292,418 B1 * | 9/2001 | Kawashima et al. ........ 365/205 |
| 6,549,450 B1 * | 4/2003 | Hsu et al. .................... 365/154 |
| 6,683,805 B2 * | 1/2004 | Joshi et al. .................. 365/156 |
| 6,922,370 B2 * | 7/2005 | Deng et al. .................. 365/226 |
| 7,116,593 B2 * | 10/2006 | Hanzawa et al. ............ 365/203 |
| 2004/0243758 A1* | 12/2004 | Notani ........................ 711/1 |
| 2005/0128852 A1* | 6/2005 | Deng et al. .................. 365/226 |
| 2005/0185474 A1* | 8/2005 | Atwood et al. ........ 365/189.01 |

* cited by examiner

*Primary Examiner*—Son L. Mai
(74) *Attorney, Agent, or Firm*—Blakely, Sokoloff, Taylor & Zafman LLP

(57) ABSTRACT

Dynamic control of a pre-charge level particularly for memory cells is described. In one example, a circuit block has pre-charge node and a power supply is coupled to the pre-charge node to provide either a first power level or a second power level when the circuit block is not active. The first power level may be a pre-charge mode power level and the second power level may be a sleep mode power level.

33 Claims, 8 Drawing Sheets

DYNAMIC PRE-CHARGE LEVEL CONTROL IN SEMICONDUCTOR DEVICES

BACKGROUND

1. Field

The present description relates to dynamically controlling a pre-charge level in a semiconductor device, and in particular to applying at least two different pre-charge levels to reduce gate leakage and power consumption.

2. Background

Semiconductor devices, such as transistors, diodes and capacitors experience current leakage. The leakage can occur in gates and other components of semiconductor devices. The leaked current generates heat so that power consumption and cooling requirements are increased. In some circumstances, current leakage can diminish signal fidelity or capacity. The leakage current can also affect other nearby devices. As a result, semiconductor systems, such as microprocessors, CPUs (Central Processing Units), ASICs (Application Specific Integrated Circuits), FPGAs (Field Programmable Gate Arrays), DSPs (Digital Signal Processors), and memory arrays, among others are often designed with an intent to reduce leakage and to guide leakage current away from sensitive portions of the semiconductor circuitry.

In memory arrays, there is significant leakage at bit-line gates and word-line gates. Many memory cell designs require constant power to maintain a memory state and to allow the memory to be read or written to. The leakage current increases the power consumption of the memory array whether or not the memory is being used. In the design of microprocessors, this leakage current has been considered to be insignificant and has been managed primarily by protecting sensitive devices from it. However, as the amount of cache memory in microprocessors increases and as the size of the transistors and other devices is reduced, the amount of leakage current in a microprocessor is increased. Similarly, the power consumed by leakage current in any large memory array increases as the number of memory cells and the cell density is increased.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
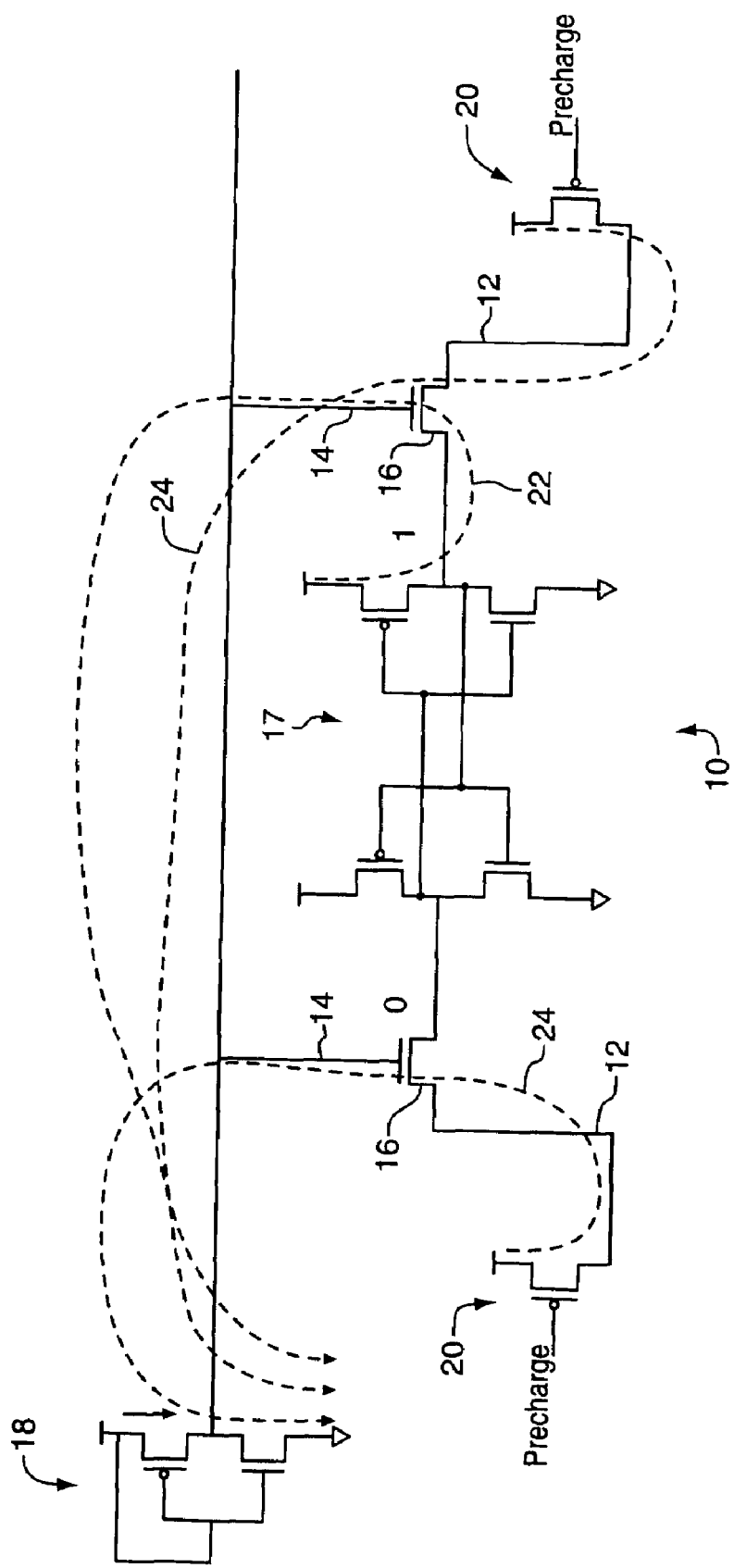
FIG. 1 is a diagram of a 6T SRAM memory cell showing some current leakage paths.

One common type of memory cell is a 6T SRAM (Six Transistor Static Random Access Memory) 10, shown, for example in FIG. 1. In one configuration, the memory has two bit-lines 12 that are held in a pre-charge high voltage (Vdd/Vcc) state by two corresponding pre-charge voltage supply circuits 20. The memory cell also has word-lines 14 that allow the memory to be read from or written to. In the conventional CMOS (Complementary Metal Oxide Semiconductor) 6T SRAM cell, there are two word-line NMOS (Negative channel MOS) pass transistors 16. The sources of the NMOS word-line transistors are coupled to the bit-lines and the drains are coupled to opposite sides of a four transistor storage cell 17. The storage cell has two PMOS (Positive channel MOS) transistors with sources held high at Vdd/Vcc, and with drains each coupled to a drain of an NMOS transistor. The sources of the NMOS transistors are grounded.

There is a word-line junction coupling the drain of each word-line transistor 16 to the junction between drains of a respective PMOS, NMOS transistor pair. This junction is also coupled to the gates of the other PMOS, NMOS transistor pair. The operation of the bit-lines and word-lines of such a conventional 6T SRAM memory cell has been well documented.

Such a memory cell has several current leakage paths. One path is from the PMOS transistor that is ON onto the word-lines 14, as indicated by arrow 22. However, the largest leakage current path is from the pre-charge devices 20 through the bit-lines 12 through the NMOS pass transistors 16, and onto the word-line drivers as indicated by arrows 24. The excess current from the word-lines accumulates at decoders 18 that operate on the word-lines. In some systems, this leakage current may be on the order of 45 nA (30 nA from the bit-lines and 15 nA from the memory cell) for each memory cell. With a 2 MB cache memory this leakage adds up to about 0.85 A or about 1.0 W. As the number of memory cells increases with new CPU designs and as transistor gate leakage increases with new, denser processes, the effects of this leakage becomes more noticeable. These leakage paths are the second largest contributor to cache standby power consumption after inherent memory cell gate leakage.

These current leakage paths lead to power dissipation and reduced reliability for the word-line drivers and memory cell NMOS pass devices in the path. Because the NMOS devices are continuously conducting the leakage current, the NMOS devices are worn more than other NMOS devices in a semiconductor system. In a CMOS logic system, the NMOS logic devices are conducting current only when they switch, but in a large memory cache, NMOS devices in the word-line drivers will constantly be conducting current to ground due to this leakage path. The NMOS devices of a large memory cache may accordingly fail before the NMOS devices of a corresponding logic system.

The leakage currents can be reduced by reducing the pre-charge voltage on the bit-lines from the standard supply voltage (Vdd/Vcc) to a lower value. The parasitic gate leakage which generates the leakage path has a strong voltage dependence. By reducing the voltage by the threshold voltage (Vtn) of the NMOS devices, for example, the power consumption due to leakage can be reduced in half. Larger voltage reductions will further reduce power consumption. The best voltage reduction value will depend upon the particular circuit design, fabrication process, and intended use.

By dynamically changing the voltage level applied to the bit-lines, memory array standby power can be reduced at the same time that word-line driver reliability is improved. In one embodiment, the invention uses NMOS sleep devices in addition to PMOS pre-charge devices to reduce the bit-line pre-charge level when the array is not being accessed (bit-line sleep mode). Control logic switches from a sleep mode to a pre-charge mode when the corresponding memory cell is to be accessed. The control logic can also ensure that the two modes are mutually exclusive.

Figure 2:
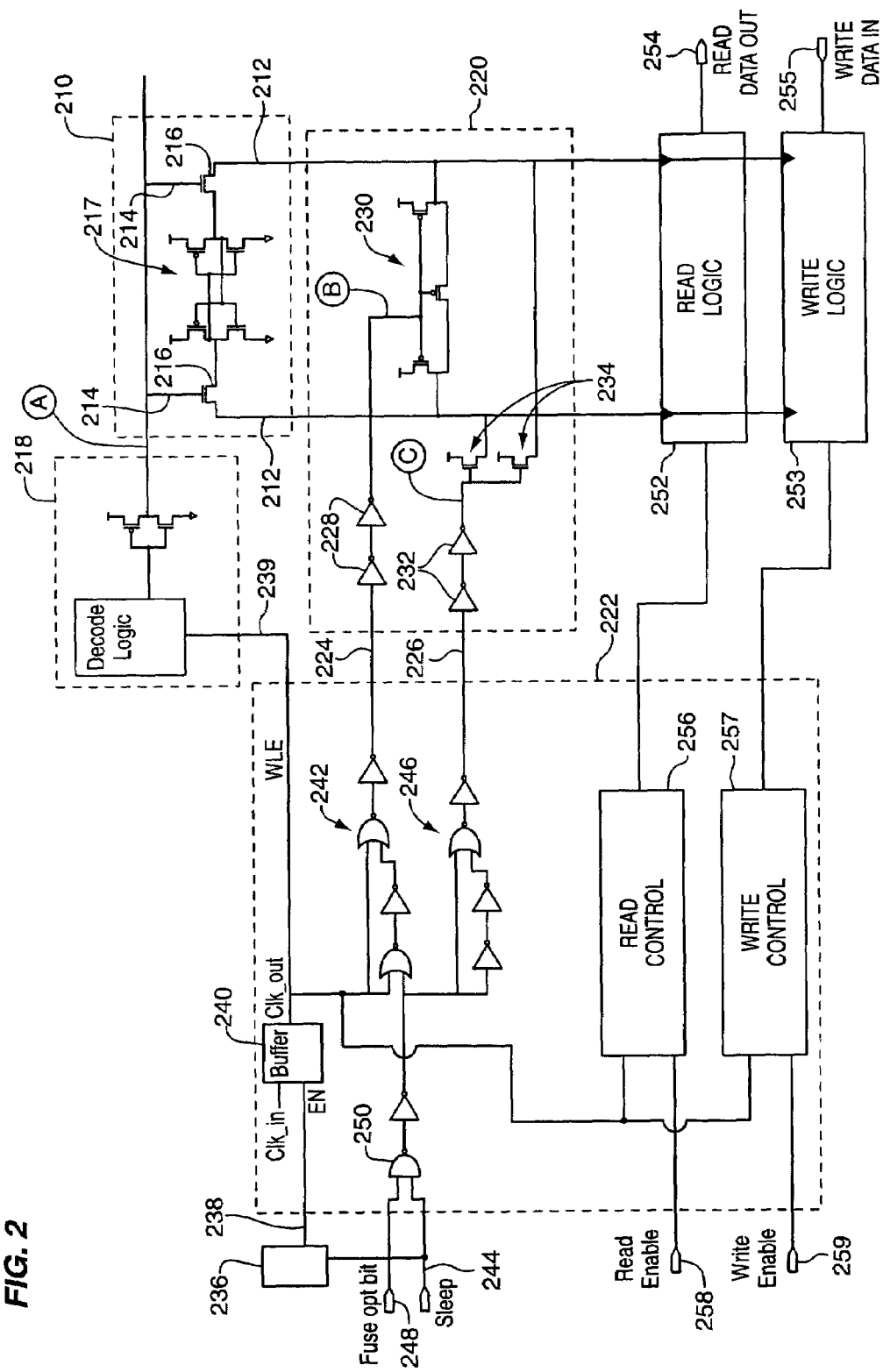
FIG. 2 is a circuit diagram of a memory cell with controllable pre-charge according to an embodiment of the present invention.

Referring to FIG. 2, a 6T SRAM (Six Transistor Static Random Access Memory) 210, similar to that of FIG. 1, has bit-lines 212 that are held in a pre-charge high voltage (Vdd/Vcc) state when the array is not being accessed. The two word-lines 214 are coupled through two word-line NMOS (Negative channel MOS) pass transistors 216 and to opposite sides of a four transistor storage cell 217.

The SRAM memory cell bit-lines are each coupled to read logic 252 and write logic 253. The read logic reads the state of the memory cell on the bit-lines and asserts it on a read data output line 254. The write data receives data on an input line 255 and writes it to the memory cell on the bit lines.

The SRAM memory cell 210 word-lines 214 are coupled to a decoder 218. The bit-lines 212 are coupled to a pre-charge circuit 220. The pre-charge circuit may provide different pre-charged voltages depending upon the status of the memory. In one embodiment, the pre-charge circuit provides either a Vdd/Vcc level active mode voltage or a (Vcc-Vtn) level sleep mode voltage. A different voltage level for the sleep mode may be selected depending on the type of memory cell and the intended use for the memory. In addition, while two modes, pre-charge and sleep, are described, additional modes may be supported to suit other applications. For example, a deep sleep mode may be provided with a still lower voltage level for longer periods of memory inactivity. The appropriate voltage level to be supplied by the pre-charge circuit is determined by control logic 222 that is coupled to the pre-charge circuit and to the decoder.

The pre-charge circuit outputs a voltage on the two bit-lines 212 of the memory cell. The appropriate voltage is determined on the basis of two received inputs, an active mode input 224 and a sleep mode input 226. The active mode input is applied to a two-inverter delay and conditioning stage 228 and then to a power supply relay 230. In the example of FIG. 2, the power supply relay has three PMOS transistors, the gates of which are coupled to the active mode input. The sources of two of the transistors are coupled to Vdd/Vcc and drains of these two transistors are coupled to the bit-lines of the memory cell. The third transistor connects the drains of the first two across its gate. Accordingly, when the active mode input is low, the gates of all three transistors are opened and Vdd/Vcc is supplied to the bit-lines. When the active mode input is high, Vdd/Vcc is cut off.

The sleep mode input is coupled to a two-inverter delay and conditioning stage 232 and then to the gates of a pair of sleep voltage NMOS transistors 234. The sleep mode NMOS transistors are coupled at their sources to Vdd/Vcc and at their drains each to one of the bit-lines. These NMOS transistors are sized to provide the desired voltage level to support the sleep mode. Accordingly, when the sleep mode input is high, then the sleep mode voltage is supplied on the bit-lines and when it is low then the sleep mode voltage is cut off. The voltage will not exceed Vcc-Vtn because the sleep devices are NMOS. Additional modes may be supported with additional control inputs and additional voltage adjustment transistors.

The particular circuit configurations shown in FIG. 2 for the pre-charge circuit are provided as examples only. A variety of other voltage and current supply circuits may be used to supply different voltages on the bit-lines in response to mode inputs. While two modes are shown, an active mode and a sleep mode, more modes may be supported depending on the intended application and on the supported memory cell. In addition, while bit-line pre-charge connections are shown, the pre-charge voltages may be supplied on other lines or types of memory inputs depending on the particular memory cell design.

While the present example is designed to support a 6T SRAM memory cell, embodiments of the invention may be adapted to suit a wide variety of different memory cell types with different voltage requirements and different configurations, including those used for large signal arrays, used, for example, in register files. In addition, other types of power supply devices may be used instead of CMOS transistors. Embodiments of the invention may also be applied to other semiconductor circuits that use a pre-charge line. A generalized circuit block with a pre-charged node may be substituted for the memory cell 210 and bit lines 212 of FIG. 2.

The control logic 222 shows examples of some features that may be used to control the pre-charge circuit. The control logic generates the active mode input 224 and the sleep mode input 226 to the pre-charge circuit to control the voltage level that is supplied to the bit-lines. It controls the timing and switching of the active and sleep mode inputs to ensure that the sleep mode and the active mode are engaged at different and appropriate times.

The control logic includes a clock buffer 240 that receives an input clock signal and generates an output clock on a word-line enable output 239 that is supplied to the decoder 218. The word-line enable output 239 is supplied to the decoder 218 whenever higher level processes wish to access the memory cell. The clock buffer 240 may be a regional clock buffer or a local clock buffer in order to synchronize the timing of the decoder enable signal. The buffer may be similar to clock buffers currently used to enable decoders to read, or write to a memory cell.

The word-line enable signal is fed to a set of active mode logic gates 242 of the control logic 222 to generate the active mode input signal 224 to the pre-charge circuit. The control logic receives another input, a sleep mode control input 244. The sleep mode control input is applied to a set of sleep mode logic gates 246 which serve, in part, to control the timing between the sleep mode signal and the active mode signal. The sleep mode input is propagated to the sleep mode input signal 226 to the pre-charge circuit 220.

The control logic has a read control block 256 coupled to the read logic and a write control block 257 coupled to the write logic 253. The read control block receives a read enable signal 258 when a read is to be performed and the write control block receives a write enable signal 259 when a write is to be performed. The read and write control block are coupled to the clock buffer output to enable or disable read and write operations.

The sets of active mode 242 and sleep mode 246 logic gates are designed to control the timing of the pre-charge circuit. A sleep mode control signal, as mentioned above, is applied to a NAND gate 250 with a fuse option bit as the gate's other input. The NAND gate output is applied to an inverter. The inverter output is split and applied in one branch to a NOR gate and in the other branch to two further inverters and then to the NOR gate. The NOR gate output is fed to one further inverter and then applied as the sleep mode input 226 to the pre-charge circuit. As a result, the sleep mode input is applied to the pre-charge circuit with well-defined timing. The NOR gate ensures that when the sleep mode control signal is turned off, the sleep mode input is maintained for two delay states based on the two inverters in the second input to the NOR gate. This allows the sleep mode pre-charge voltage shut-off to be aligned with the active mode pre-charge voltage.

The active mode logic gates receive the word-line enable from the clock buffer 240 and apply this signal to two different NOR gates. The first NOR gate also receives the sleep mode inverter output. This NOR gate output is fed to an inverter and then to the second input of the second NOR gate. The second NOR gate output is fed to an inverter and then to the pre-charge circuit as the active mode input 224. Using these gates, the pre-charge voltage may be shut off if either the word-line enable signal 239 or the sleep line is active, as shown by the timing diagrams in FIG. 3. This controls the timing to ensure that the pre-charge voltage does not overlap a memory cell access.

The clock buffer's word-line enable 239 is affected by the sleep signal 244 through an external buffer 236. The sleep signal is applied to the external buffer and then applied as an enable to the clock buffer 240. Accordingly, the clock buffer is disabled when the memory is in sleep mode. The external buffer 236 may be external to the memory array that includes the SRAM cell, the pre-charge circuit and the control logic or it may be integrated into the control logic. The buffer may serve as clock control logic or mode distribution logic to control pre-charge and sleep modes for several memory cells or banks of memory cells.

During normal array operation, if the clock output is high (1), then the pre-charge voltage (active and sleep levels) is off and the array is being accessed. The memory cell is prevented from being placed in either sleep or pre-charge mode. If instead the clock output is low (0), then the array goes into pre-charge mode. This prevents any access of the memory cell because the word-line is disabled.

Figure 3:
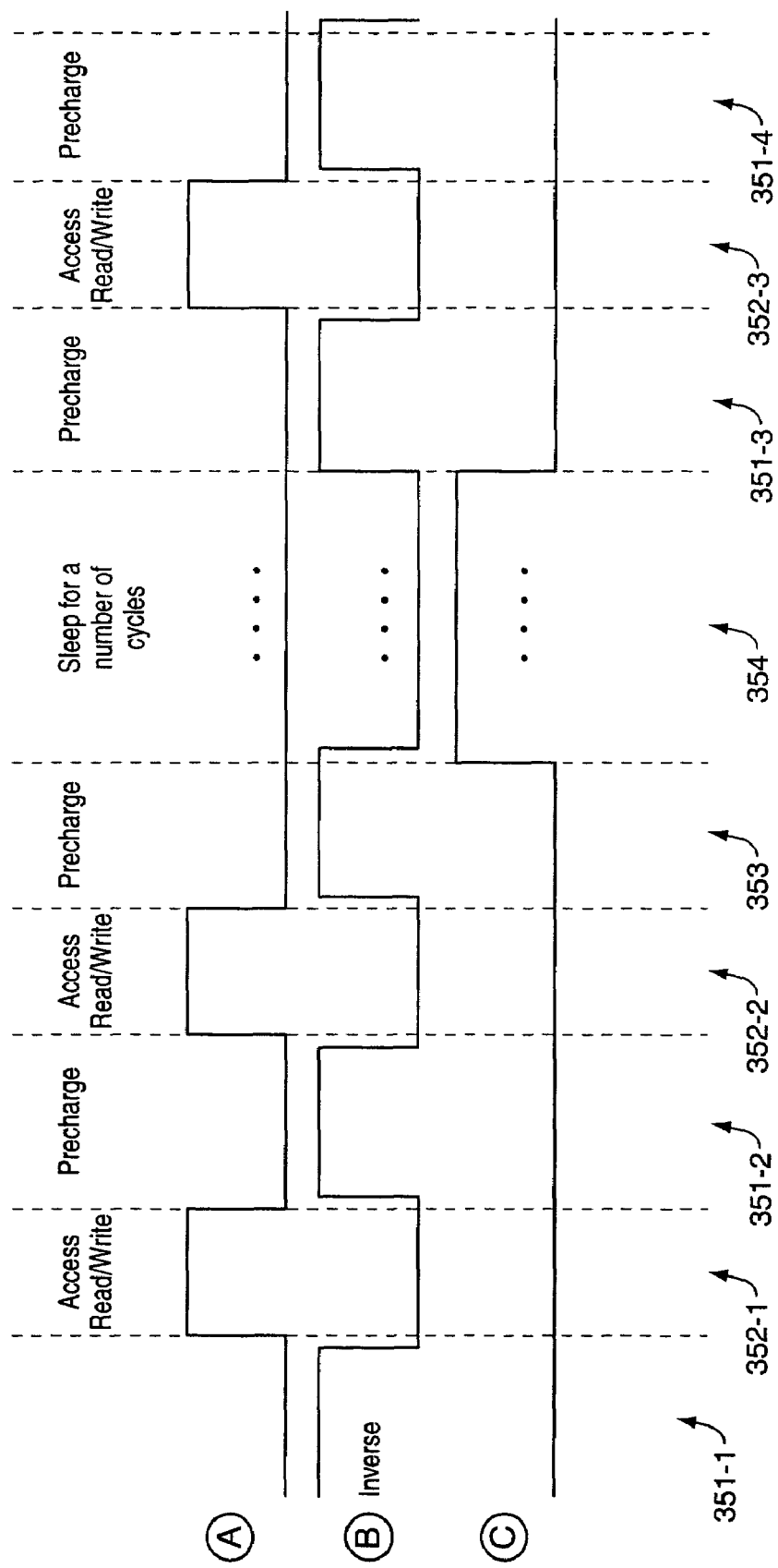
FIG. 3 is a timing diagram of voltage at selected places in the circuit of FIG. 2.

If the sleep input 244 is asserted, then the external logic 236, in response to the sleep input, sets the enable input to the clock buffer low and the word-line enable signal 239 is deactivated. As mentioned above, this prevents any access to the memory cell. In one embodiment, the clock buffer, when it is deactivated stops at a low (0) output signal. In addition, the asserted sleep signal propagates through the control logic 222 to turn on the sleep mode voltage transistors 234 of the pre-charge circuit. This allows the bit-lines to enter the sleep mode. The sleep mode signal also shuts off the pre-charge voltage. The pre-charge voltage circuit transistors 230 of the pre-charge circuit 220 turn off 2 gates after the sleep mode signal is asserted. The timing is shown in FIG. 3.

When "waking up" the bit-lines, the sleep signal is deasserted (returns to 0), and the sleep voltage transistors 234 turn off as the pre-charge voltage transistors 230 turn on. In a typical 6T SRAM, 1 clock cycle of pre-charge voltage is enough time to get the bit-lines back to Vdd/Vcc. The external block 236 or the clock buffer may be designed to provide this short delay before the word-line enable 239 is asserted. Additional functions and control may be provided by additional external or internal logic. A few of the timing relationships discussed herein are provided by additional logic which is not shown in the figures in order to simplify the understanding and presentation of this description.

FIG. 2 further shows a fuse or option bit that may be used to disable the sleep mode if it is found to be defective or unsuitable for a particular application. This allows a single integrated circuit design to be used both in applications in which sleep mode is desired and also in other applications in which sleep mode is not desired. The sleep mode fuse option bit 248 is another input to the control logic. This bit may be an output of a settable parameter that may be set electrically or burned in. The fuse bit input is combined with the sleep mode control input in a NAND gate 250. The output of the NAND-inverter combination is applied to the sleep mode logic gates 246. As a result, if the bit is set low, then the sleep mode is disabled. The output of the NAND-inverter combination will always be low. If it is set high, then the sleep mode is enabled because the NAND gate output will be controlled by the sleep mode control bit. The fuse option bit may be set permanently before the circuit is shipped or it may be set in software by a BIOS (Basic Input/Output System) boot process or some other software system.

In operation, when the memory cell will not be accessed for some selected period of time, the sleep signal is asserted. The selected period of time may depend upon the memory or computer system architecture, performance settings, applications and other system aspects. If the fuse option bit and sleep signal are enabled, this will cause the NMOS sleep power devices 234 to "turn on" and then the PMOS active mode power devices 230 to "turn off" 2 logic stages later. At this point, the bit-lines will leak onto the word-lines through the NMOS gates 216 until the bit-lines reach the sleep mode voltage (e.g. Vcc-Vtn), at which time the system will be in equilibrium. Power savings are realized as soon as the PMOS devices are disabled. When the bit-lines need to be "woken up", the sleep signal is de-asserted, causing the NMOS sleep mode power devices 234 to "turn off" and the PMOS active mode devices 230 to "turn on." Some time will then be needed to fully pre-charge and equalize the bit-lines before any operations are attempted.

Since the sleep signal also controls the clock buffer, and hence the word-line enable, normal memory array operations (pre-charge, read, and write) and bit-line sleep are mutually excluded. In other words the read and write operations cannot be performed when the memory is in sleep mode.

FIG. 3 is a timing diagram that shows the effects of the various delay lines and logic gates within the control logic in coordinating the active and sleep mode input signals. In FIG. 3, all three lines are plotted against time horizontally and the vertical axis shows one of two states, high or low, for each of the three time lines A, B inverse, C. The first line, A, shows the state of the word-line 214 out of the decoder 218 in FIG. 2. The second line, B inverse, shows the inverse of the switching signal that is applied to switch the transistors 230 of the pre-charge circuit that control the active mode pre-charge voltage. The third line, C, shows the switching signal that is applied to the transistors 234 of the pre-charge circuit 220 that control the sleep mode voltage. In FIG. 3, signal B has been inverted to ease understanding of the signals.

The timing diagram of FIG. 3 shows a few access cycles in which the bit-lines begin in a pre-charge state and then the pre-charge current is shut off just before the word-line is asserted. The pre-charge state cycles are indicated as 351-1, 351-2, 351-3, 351-4, and 353. In the active pre-charge state, the active pre-charge voltage, indicated by B inverse is high, while the word-line A and sleep mode C are low. Immediately before the memory cell is accessed, the active precharge voltage B inverse is turned off while the sleep pre-charge voltage C is not changed. This is shown in the access cycles 352-1, 352-2, and 352-3. Similarly, the active pre-charge voltage is turned on shortly after the word-line is turned off. The particular timing between the word-lines and bit-lines for the pre-charge voltage will depend upon the particular application to which the memory is put, as well as on the design of the memory.

If the memory will not be accessed for a sufficient period of time, then the pre-charged voltage is switched from active mode to sleep mode. In section 353, the memory is in a standard pre-charge active mode voltage. In section 354, the sleep mode voltage B is enabled and then after a short delay, the active voltage B is turned off. The short delay helps to ensure that the bit-lines are always driven. In other words, the bit-lines are not allowed to float for long periods of time. At the end of the sleep cycle 354, the sleep mode C is turned off and the active mode B is turned on at about the same time. This starts the active mode voltage more quickly so that the memory may be accessed sooner. The specific selection of timings may be modified to suit any particular application. The timings shown in FIG. 3 are not specific and are not drawn to scale. No units of time are provided because the best choice of scale in any particular embodiment, will depend on the design of the memory as well as on the intended use for the memory.

Figure 4:
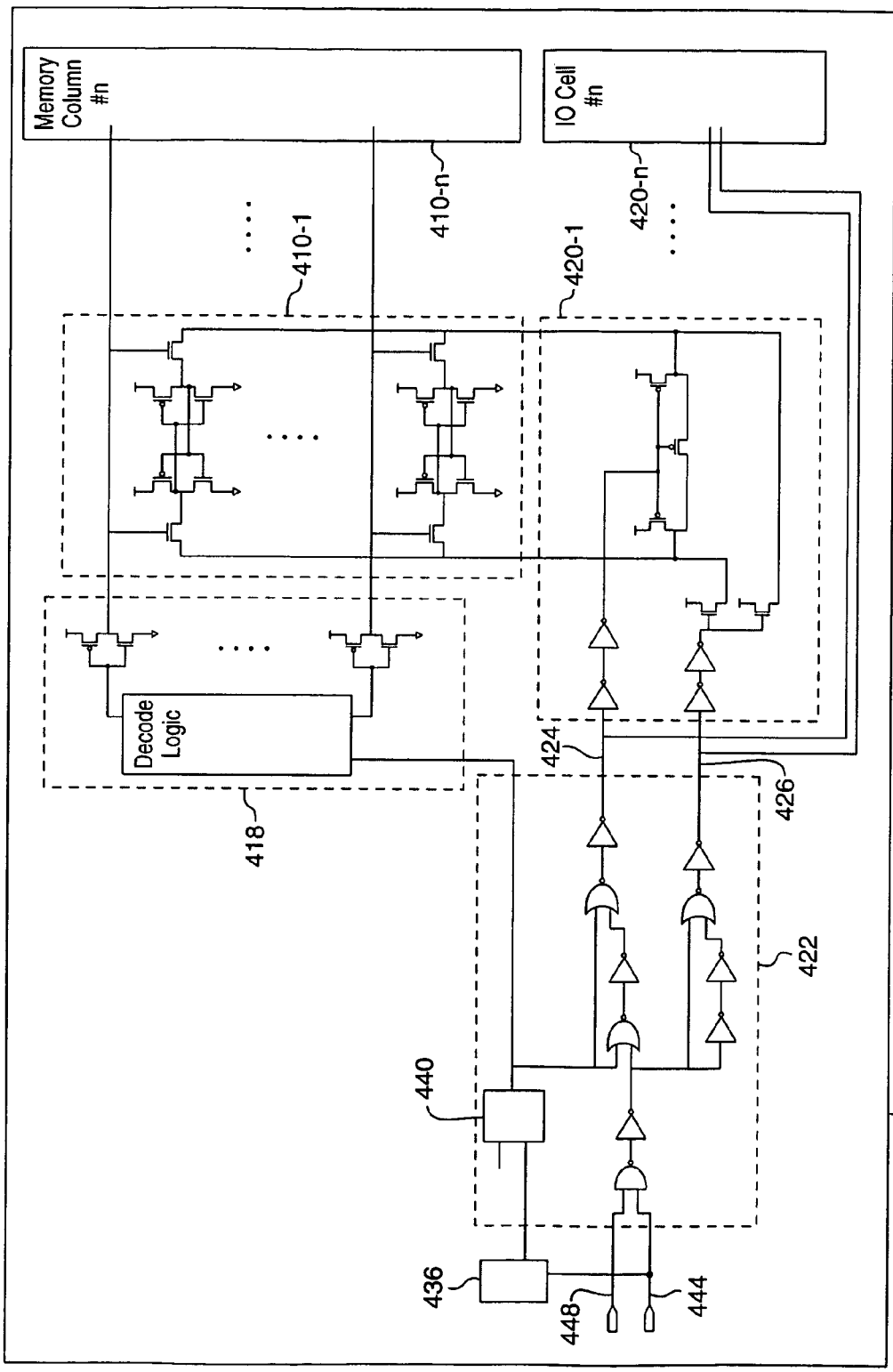
FIG. 4 is a circuit diagram of a sub-array of memory cells with controllable pre-charge according to an embodiment of the present invention.

FIG. 4 shows a memory sub-array 400 suitable for implementing an embodiment of the present invention. The sub-array of FIG. 4 has many columns of memory cells and each column contains many memory cells. The single decode logic module 418 accesses any one of the memory cells in the sub-array using a suitable addressing and multiplexing convention. While FIG. 2 showed a single memory cell, the embodiment of FIG. 4 allows a single control logic module 422 to control multiple pre-charge circuits 420-*l* to 420-*n*. Each pre-charge circuit provides active and sleep mode power to one of the many columns of memory cells 410-*l* to 410-*n*.

FIG. 4 demonstrates the circuit economies that may be achieved when a memory cache has thousands or millions of memory cells. In a typical 2 MB memory cache, there may be over 16,000,000 memory cells. These may be divided into 10 banks, each of which has 10 sub-arrays. The sub-arrays may be interleaved with 8 ways. Each sub-array may have 250 columns, and each column may have 512 individual memory cells. The particular number of cells and the particular division of the cells among columns, arrays, blocks or any other grouping elements may depend upon the particular application to which the memory is to be applied. The 2 MB cache is provided only as an example.

Figure 5:
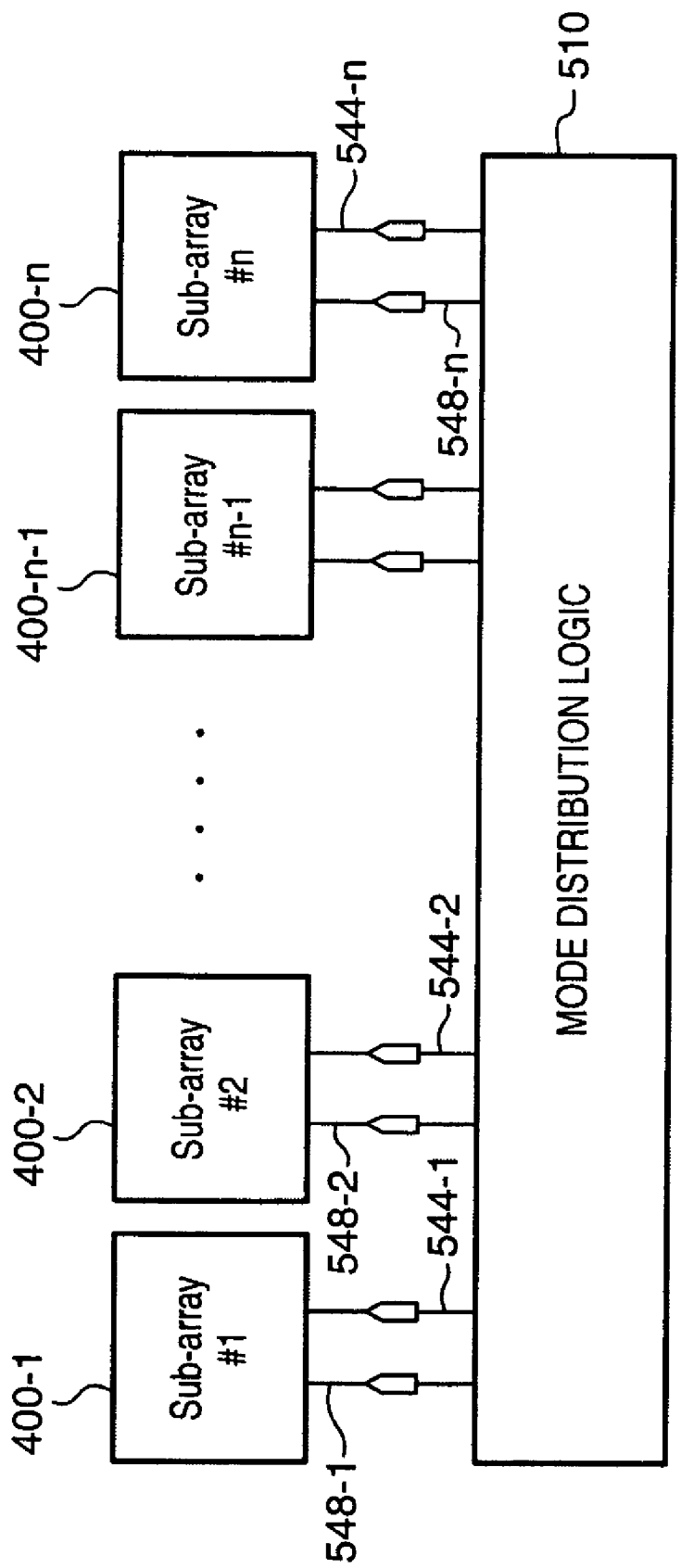
FIG. 5 is a block diagram of control and distribution logic for pre-charge selection for a group of memory sub-arrays according to an embodiment of the present invention.
Figure 6:
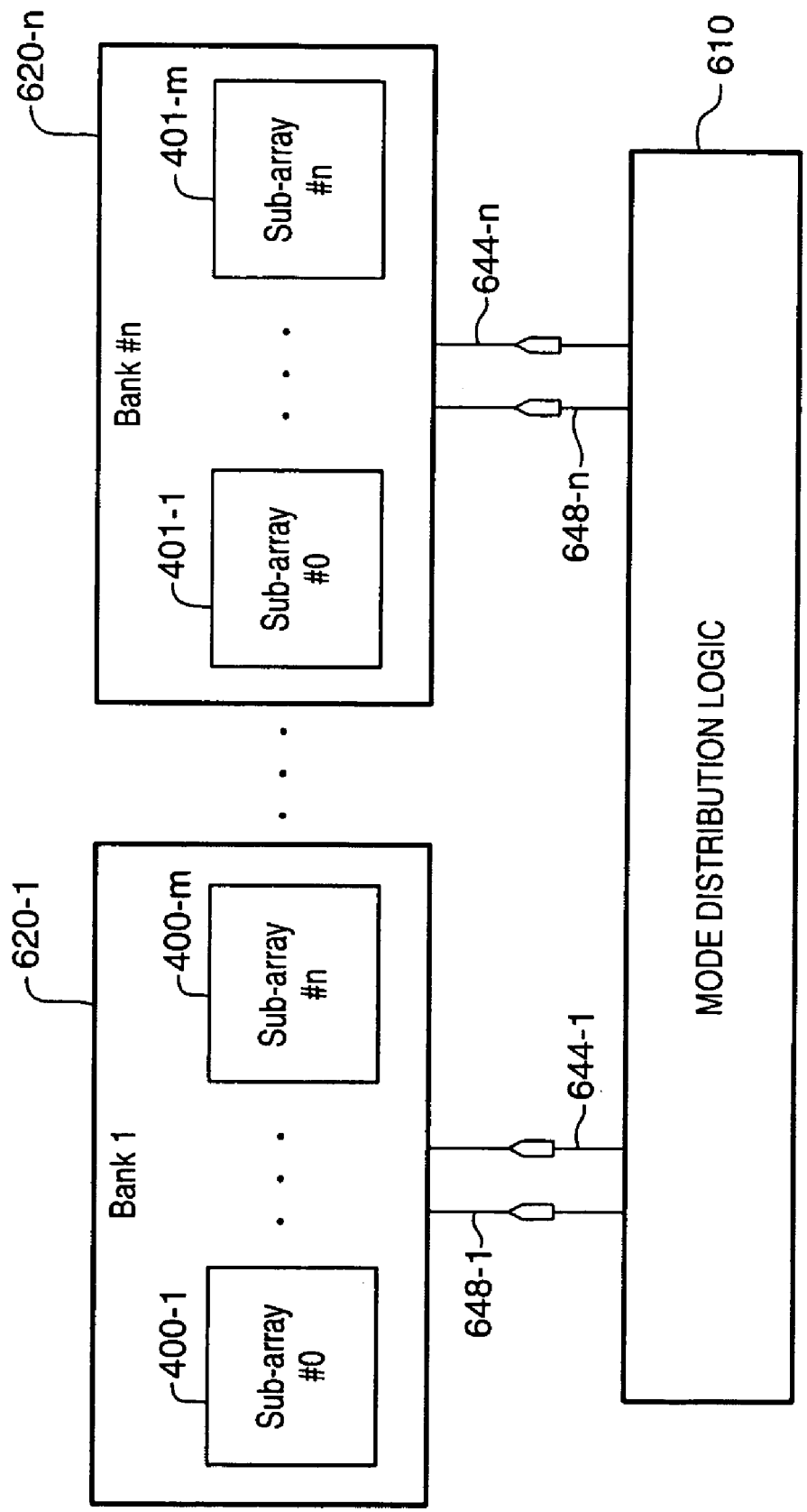
FIG. 6 is a block diagram of control and distribution logic for pre-charge selection for banks of memory sub-arrays according to an embodiment of the present invention.

The control logic 422 works in the same way as the control logic of FIG. 2 receiving signals at a clock buffer 440 and from a sleep mode control input 444. A fuse option bit 448 may also be provided. Active mode and sleep mode input signals 424, 426 are similarly provided with appropriate timing as described above with reference to FIGS. 2 and 3. These two signals are propagated to all of the pre-charge circuits 420 in the sub-array 400. In the example of FIG. 4, the number of pre-charge circuits is indicated as ranging from 1 to n, so that the total number of pre-charge circuits is n and n may be tens or hundreds, as mentioned above, depending on the application. Each pre-charge circuit supplies either an active or sleep mode voltage to its respective one of the n memory columns 410. Using the architecture in FIG. 4, bit-lines in the sub-array may be placed in active pre-charge mode when any one memory cell in the sub-array is to be accessed. When there is no activity every bit-line may be switched to sleep pre-charge mode. As shown in FIGS. 4, 5, and 6, a memory cache may be composed of many columns. The system of FIG. 4 may be modified so that some of the columns may be in sleep mode while other columns are in active mode.

FIG. 5 shows how a group of sub-arrays 400 similar to that shown in FIG. 4 may be coupled together through a single mode distribution logic module 510. The mode distribution logic module has a sleep mode control signal output 544-*l* to 544-*n* which is applied to each of the memory sub arrays 400-*l* to 400-*n*. These sleep mode control signals may be set high or low independently of each other so that the different sub-arrays may be moved to and from sleep mode independently of each other. With a large number of different sub-arrays, independently operated, each sub-array may be placed in sleep mode whenever that sub-array is not being accessed. This may significantly reduce the total power consumed by the memory array. The mode distribution logic of FIG. 5 also has a fuse option bit 548-*l* to 548-*n* to each of the memory sub-arrays that allow the sleep mode to be disabled as described above with respect to FIG. 2. The memory array of FIG. 4 may also include timers, decoders and other ancillary modules and components but these are not shown in order to simplify the diagram. In addition, while FIG. 5 shows a separate fuse bit for each sub-array, the fuse bits may be consolidated at a higher level or embedded within the sleep mode output. In this way, only one signal is sent to each sub-array not two.

FIG. 6 shows a memory that is divided into n banks 620-*l* to 620-*n*. Each bank includes m sub-arrays. The first bank has sub-arrays 400-*l* to 400-*m* and the second bank has sub-arrays 401-*l* to 401-*m*. In the example of FIG. 6, the mode distribution logic 610 sends a unique sleep mode control input 644-*l* to 644-*n* to each memory bank. All of the sub-arrays of any one bank are then placed in or out of sleep mode together. The control logic of the bank distributes sleep mode and active mode signals to each of the sub-arrays and to each of the cells in each sub-array. The control logic within each bank may be similar to that shown in FIG. 4 or it may be modified to suit a particular application. The mode distribution logic also has a fuse option bit 648-*l* to 648-*n* for each memory bank to independently disable the sleep mode for each memory bank as described above with respect to FIG. 2.

FIGS. 5 and 6 show two memory organization models. While banks and arrays are shown, embodiments of the present invention may be adapted to many different memory types and many different memory structures. These structures include ways, arrays, banks and more. The particular number of memory cells to be individually controlled may also be determined based on the intended use and organization of the memory system. In addition, as with the example of FIG. 4, the sleep mode and fuse bit signal lines may be logically combined and distributed as one signal, the fuse bit signal may be eliminated, or it may be moved to higher layers.

Figure 7:
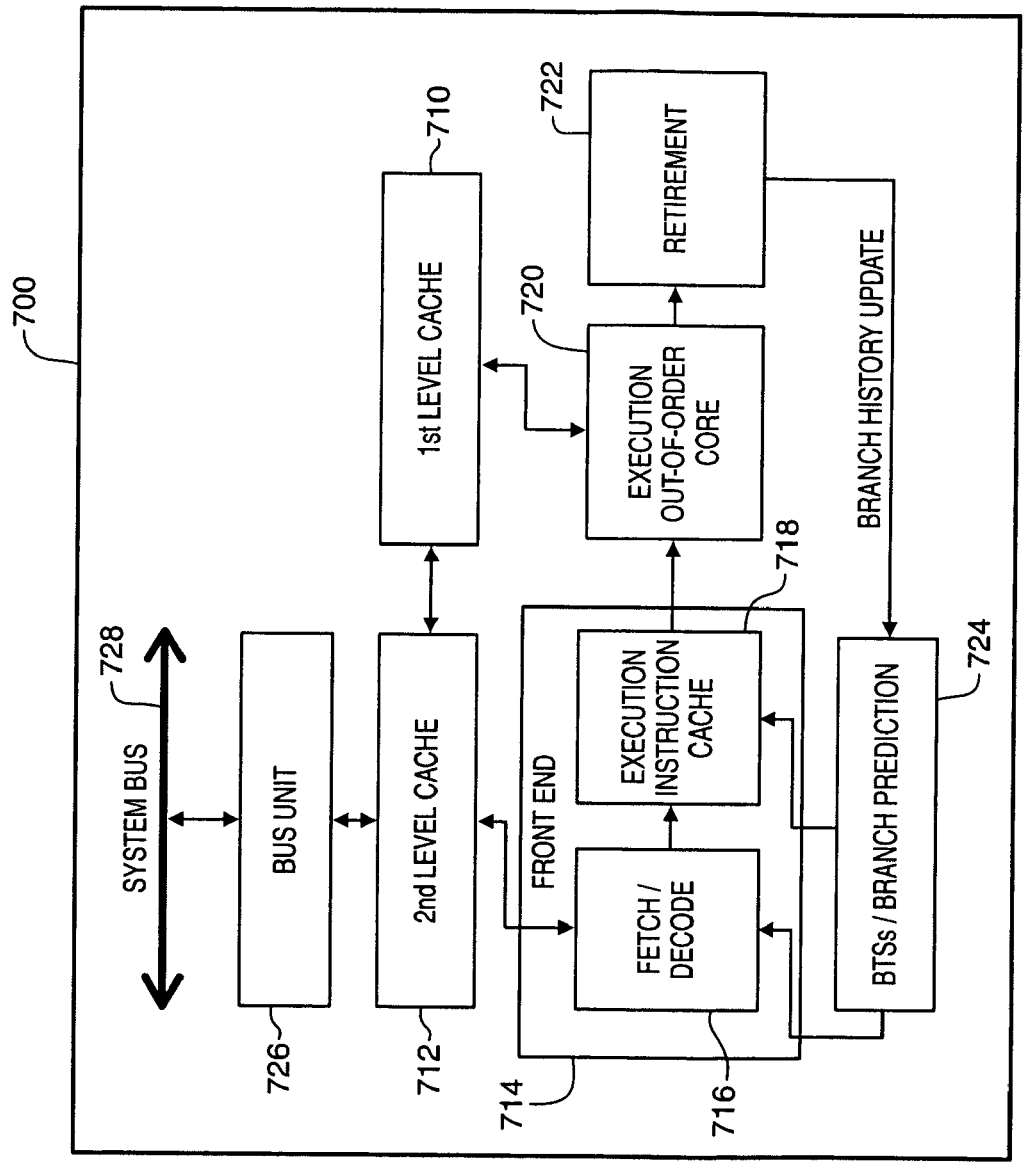
FIG. 7 is a block diagram of a microprocessor architecture to which embodiments of the present invention may be applied.

FIG. 7 shows a microprocessor 700 that may be used in a computing system or any of a variety of different embedded systems. The microprocessor has a cache memory divided into a 1st level cache 710 and a 2nd level cache 712 coupled to the 1st level cache. Both cache memories may be divided into arrays or banks as described above with respect to FIGS. 5 and 6. More or fewer caches and cache levels may be provided as desired for a particular operation. The caches are coupled to an out-of-order execution core 720 and a fetch/decode block of a main execution core 714, respectively. These execution cores fetch instructions and intermediate results from the caches, reading and writing to the memory cells as necessary.

The illustrated microprocessor uses branch prediction and so the fetch/decode block of the main execution core is coupled to an execution block 718 which is coupled to the out-of-order execution core 720, which is coupled to a retirement block. The retirement unit searches the instruction pool for completed instructions that no longer have data dependencies with other instructions or unresolved branch predictions. It commits the results of completed instructions to memory in the order they were originally issued and retires instructions from an instruction pool. It then updates the branch history with the main execution core through a branch prediction block 724.

The cache memories are also coupled to a bus unit 726 which allows for communication of data values over a system bus 728 with external components. The mode distribution logic may be contained within the fetch/decode block 714 or the out-of-order execution core 720 or it may be incorporated within the cache memories or within any combination. Similarly, the control logic may be contained within the caches or in another external unit. The microprocessor of FIG. 7 is shown as an example application for the memory and pre-charge components described above, however, embodiments of the invention may be applied to other types of controllers and processors as well as to stand-alone memory systems.

Figure 8:
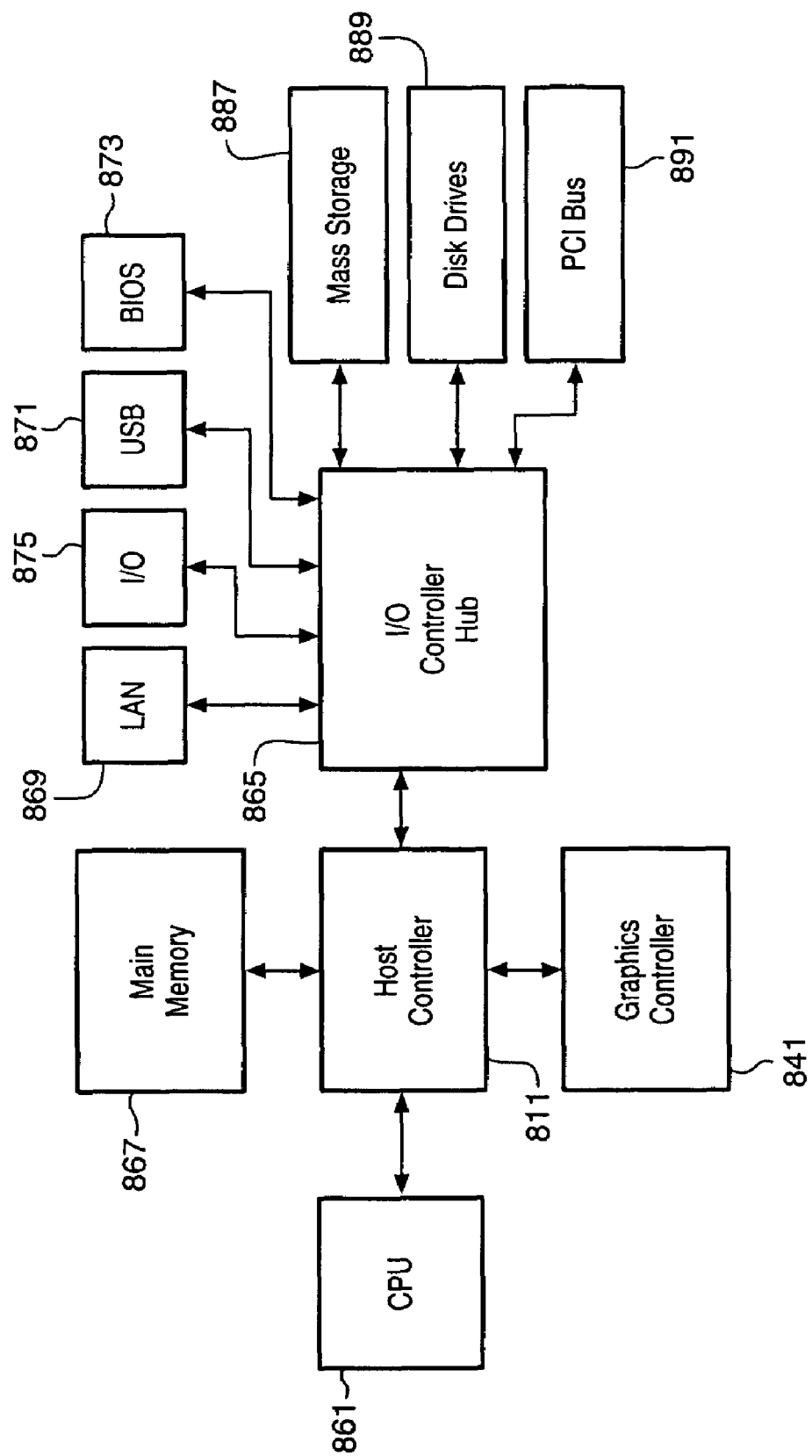
FIG. 8 is a block diagram of a computer system to which embodiments of the present invention may be applied.

FIG. 8 shows an example of a computer system containing several different memory components to which embodiments of the present invention may be applied. Embodiments of the present invention may be adapted for application to a great number of different chips which include memory components, including microprocessors, chipsets, graphics processors, system memory and bus interfaces. In this example, the computer system may include a CPU (Central Processing Unit) 861 coupled to a chipset component 811 such as a host controller or an MCH (Memory Controller Hub) chip. The MCH functions as part of a supporting chipset for the CPU. The MCH is coupled to a main memory 867, such as DRAM (Dynamic Random Access Memory) and to a graphics controller 841. The microprocessor and graphics controller may have a significant amount of on-die SRAM.

The MCH 811 is also coupled to an ICH (Input/Output Controller Hub) 865. The ICH offers connectivity to a wide range of different devices. Well-established conventions and protocols may be used for these connections. The connections may include a LAN (Local Area Network) port 869, a USB hub 871, and a local BIOS (Basic Input/Output System) flash memory 873. A SIO (Super Input/Output) port 875 may provide connectivity for a keyboard, a mouse, and any other human interface devices.

The ICH may also provide an IDE (Integrated Device Electronics) bus for connections to disk drives 887, 889 or other large memory devices. The mass storage may include hard disk drives and optical drives. A PCI (Peripheral Component Interconnect), a PCI-X bus or a PCI-Express bus 891 may be coupled to the ICH to allow a wide range of devices and ports to be coupled to the ICH. The architecture of FIG. 8 allows for a wide range of different functions and capabilities. The specific details of any implementation may depend on the particular application.

The CPU, MCH, ICH, LAN port USB hub, BIOS, SIO port, IDE and PCI buses may all be carried on a single motherboard of the computer system. Any one or more peripheral devices may also be carried on the motherboard.

The computer system may be adapted for use in many different applications including office productivity, communications, entertainment, music and video production or manufacturing.

The particular configurations, circuits, control lines and memory cells shown are provided as examples of embodiments of the present invention. Individual transistors are shown for illustration purposes, while embodiments of the invention may be applied to systems with hundreds, thousands or millions of devices. Embodiments of the present invention may be applied to many different chips or dies and in many different configurations.

Embodiment of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection.

It is to be appreciated that a lesser or more complex memory cell, pre-charge circuit, control logic, memory system, integrated circuit, or microprocessor than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
 a memory cell having a bit-line and a word-line;
 a decoder to receive a word line enable signal and to make the word line of the memory cell active when the word line enable signal is active;
 a power supply coupled to the bit-line to receive the word line enable signal and to provide a first power level for the bit-line when the word line enable signal is active, and one of the first power level and a second power level for the bit-line when the word-line enable signal is not active.

2. The apparatus of claim 1, wherein the first power level is a pre-charge level to maintain a bit-line state level and the second power level is a lower power level to maintain the bit-line in a reduced power state.

3. The apparatus of claim 1, wherein the second power level has a voltage lower than the first power level.

4. The apparatus of claim 3, wherein the memory cell includes transistors having a threshold voltage and wherein the voltage of the second power level is lower than the voltage of the first power level by about the threshold voltage.

5. The apparatus of claim 1, further comprising control logic coupled to the power supply to control the power level supplied by the power supply.

6. The apparatus of claim 5, wherein the power supply receives a sleep mode input corresponding to the second power level and an active mode input corresponding to the first power level and wherein the control logic times the sleep mode input and the active mode input in order to maintain the state of the bit-lines.

7. The apparatus of claim 5, wherein the control logic further controls the timing of the power supply in providing the first power level and the second power level.

8. The apparatus of claim 1, further comprising a plurality of additional memory cells each having a bit-line input and a word-line, and wherein the power supply is coupled to each of the bit-line inputs.

9. The apparatus of claim 1, wherein the bit-line is a voltage input.

10. An apparatus comprising:
a memory cell having a word line;
a decoder to receive a word line enable signal and to make the word line of the memory cell active when the word line enable signal is active;
a pre-charge circuit to supply a standby pre-charge voltage to the memory cell when the memory cell is not being accessed as indicated by the word line enable signal; and
a timing circuit to reduce the power of the pre-charge voltage when the word line enable signal is not active.

11. The apparatus of claim 10, wherein the memory cell has a bit-line and the pre-charge voltage is applied to the bit-line when the word-line is not active.

12. The apparatus of claim 10, wherein the timing circuit comprises a sleep power supply circuit, the timing circuit switching the pre-charge voltage from the standby level to a second lower sleep level provided by the sleep power supply circuit.

13. The apparatus of claim 12, wherein the timing circuit comprises a set of logic gates.

14. The apparatus of claim 10, wherein the timing circuit is further to restore the standby pre-charge voltage before the memory cell is accessed as indicated by the word line enable signal.

15. A method comprising:
providing a pre-charge power to a memory cell at a first power level in response to a word line enable signal, the word line enable signal indicating whether the memory cell is to be accessed;
reducing the pre-charge power to a second lower power level in response to the word line enable signal;
restoring the pre-charge power to the first power level in response to the word line enable signal;
shutting off the pre-charge power to allow the memory cell to be accessed in response to the word line enable signal; and
restoring the pre-charge power to the first power level after the memory cell is accessed in response to the word line enable signal.

16. The method of claim 15, wherein providing a pre-charge power comprises supplying a voltage to bit-lines of the memory cell.

17. The method of claim 15, wherein reducing the power level comprises reducing the voltage level during a long period of memory cell inactivity.

18. The method of claim 15 wherein reducing the power level comprises reducing the power level in response to a sleep command from a higher level controller.

19. The method of claim 15, wherein reducing the power level comprises applying the second lower power level, and then after a delay, shutting off the first power level.

20. The method of claim 19, wherein restoring the pre-charge power to the first power level comprises shutting off the second power level and applying the first power level.

21. An article comprising a machine readable medium including data that when accessed by a machine causes the machine to perform operations comprising:
providing a pre-charge power to a memory cell at a first power level in response to a word line enable signal, the word line enable signal indicating whether the memory cell is to be accessed;
reducing the pre-charge power to a second lower power level in response to the word line enable signal;
restoring the pre-charge power to the first power level in response to the word line enable signal;
shutting off the pre-charge power to allow the memory cell to be accessed in response to the word line enable signal; and
restoring the pre-charge power to the first power level after the memory cell is accessed in response to the word line enable signal.

22. The article of claim 21, wherein reducing the power level comprises reducing the power level during a long period of memory cell inactivity.

23. The article of claim 21, wherein reducing the power level comprises applying the second lower power level, and then after a delay, shutting off the first power level.

24. A memory system comprising:
a plurality of memory cells each having a standby power input line;
a decoder coupled to each of the plurality of memory cells to receive a word line enable signal indicating that the respective memory cell is to be accessed;
a mode distribution logic module to generate a command to put at least a portion of the memory cells into a sleep mode; and
a pre-charge circuit coupled to each of the plurality of memory cells to provide standby power to the standby power input line based on the word enable signal and the command.

25. The system of claim 24, wherein the pre-charge circuit generates a first pre-charge power level and a second sleep power level and supplies one of the pre-charge power level and the sleep power level to the at least a portion of the memory cells in response to the command.

26. The system of claim 25, further comprising a control logic circuit to control timing of the pre-charge power level and the sleep power level in response to the command.

27. The system of claim 24, wherein the plurality of memory cells comprises a first column of memory cells and a second column of memory cells and wherein the mode distribution logic generates a first sleep mode command for the first column and a second sleep mode command for the second column.

28. A computer system comprising;
   a bus;
   an input/output controller coupled to the bus; and
   a microprocessor coupled to the bus, the microprocessor having a cache memory, the cache memory having a memory cell with a bit-line and a word-line, a decoder to receive a word line enable signal and to make the word line of the memory cell active when the word line enable signal is active; and a power supply coupled to the bit-line to receive the word line enable signal and to provide a first power level for the bit-line when the word line enable signal is active, and one of the first power level and a second power level for the bit-line when the word-line enable signal is not active.

29. The system of claim 28, wherein the first power level is a pre-charge level to maintain a bit-line state level and the second power level is a lower power level to maintain the bit-line state when the memory cell is in sleep mode.

30. The system of claim 29, further comprising control logic coupled to the power supply to control the power level supplied by the power supply, wherein the power supply receives a sleep mode input corresponding to the second power level and an active mode input corresponding to the first power level and wherein the control logic times the sleep mode input and the active mode input in order to maintain the state of the bit-lines.

31. An apparatus comprising:
   a circuit block having a pre-charge node and a word line input;
   a power supply coupled to the pre-charge node and to a word line enable signal to provide a first power level when the circuit block is active as indicated by the word line enable signal, and one of the first power level and a second power level when the circuit block is not active as indicated by the word line enable signal.

32. The apparatus of claim 31, wherein the power supply receives a sleep mode input corresponding to the second power level, wherein the word line enable signal corresponds to the first power level, and wherein the apparatus further comprises control logic to time the sleep mode input and the word line enable signal in order to maintain the state of the pre-charge node.

33. The apparatus of claim 31, wherein the second power level is a lower power level than the first power level to maintain the circuit block in a reduced power state.

* * * * *